(12) United States Patent
Xiao

(10) Patent No.: US 9,773,891 B1
(45) Date of Patent: Sep. 26, 2017

(54) FINFET AND FABRICATION METHOD THEREOF

(71) Applicant: ZING SEMICONDUCTOR CORPORATION, Shanghai (CN)

(72) Inventor: Deyuan Xiao, Shanghai (CN)

(73) Assignee: ZING SEMICONDUCTOR CORPORATION, Shanghai (CN)

( * ) Notice: Subject to any disclaimer, the term of this patent is extended or adjusted under 35 U.S.C. 154(b) by 0 days.

(21) Appl. No.: 15/270,992

(22) Filed: Sep. 20, 2016

(30) Foreign Application Priority Data

Mar. 3, 2016 (CN) .......................... 2016 1 0120862

(51) Int. Cl.
| | | |
|---|---|---|
| *H01L 29/10* | (2006.01) | |
| *H01L 29/66* | (2006.01) | |
| *H01L 29/06* | (2006.01) | |
| *H01L 29/78* | (2006.01) | |
| *H01L 29/51* | (2006.01) | |
| *H01L 21/28* | (2006.01) | |

(52) U.S. Cl.
CPC .. *H01L 29/66795* (2013.01); *H01L 21/28264* (2013.01); *H01L 29/0649* (2013.01); *H01L 29/511* (2013.01); *H01L 29/785* (2013.01)

(58) Field of Classification Search
CPC ........... H01L 29/66795; H01L 29/0649; H01L 21/28264; H01L 29/511; H01L 29/785; H01L 21/823821; H01L 21/845; H01L 27/0886; H01L 27/0924; H01L 27/10826; H01L 27/10879; H01L 27/1211; H01L 29/41791

See application file for complete search history.

(56) References Cited

U.S. PATENT DOCUMENTS

2016/0240652 A1* 8/2016 Ching .................... H01L 29/785

* cited by examiner

*Primary Examiner* — Cuong B Nguyen
(74) *Attorney, Agent, or Firm* — Huffman Law Group, PC

(57) ABSTRACT

Present embodiments provide for a FinFET and fabrication method thereof. The fabrication method includes two selective etching processes to form the channel. The FinFET includes a substrate, a shallow trench isolation (STI) layer, a buffer layer, a III-V group material, an oxide-isolation layer, a high-K dielectric layer and a conductor material. The STI is formed on the substrate with a trench. The buffer layer is formed on the substrate in the trench. The III-V group material is formed on the buffer layer in vertical stacked bowl shape. The oxide-isolation layer is formed between the substrate and the III-V group material. The high-K dielectric layer is formed on the STI layer and surrounding the III-V group material. The conductor material is formed surrounding the high-K dielectric layer.

18 Claims, 6 Drawing Sheets

FINFET AND FABRICATION METHOD THEREOF

INCORPORATION BY REFERENCE

This application claims priority to P.R.C. Patent Application No. 201610120862.7, titled "FinFET and Fabrication Method Thereof," filed Mar. 3, 2016, with the State Intellectual Property Office of the People's Republic of China (SIPO).

TECHNICAL FIELD

The present disclosure relates to a FinFET and fabrication method thereof.

BACKGROUND

The III-V group semiconductor, such as GaAs and InAs, has a higher mobility, such that it can conduct higher drive current. It has been proven that the efficiency of the III-V group MOSFET has risen tremendously and the III-V group MOSFET has low gate leakage current, high channel mobility and high drive current. Therefore, it is feasible to fabricate MOSFET with high efficiency by using III-V group material.

Miniaturization of CMOS derives many physical limitations and problems, so that three-dimension fin field-effect transistor (FinFET) is a prospect substitution, which makes the miniaturization of transistor excess the technology node of 10 nm. The structure of FinFET can perfectly control short-channel effect. However, the drive current of FinFET using III-V group material still needs to be improved.

SUMMARY

Thus an object of the present invention is to provide a fin-shaped field-effect transistor (FinFET) and fabrication method thereof.

To solve above mentioned problems, the fabrication method of a FinFET comprises the following steps: providing a substrate; depositing a shallow trench isolation (STI) layer on the substrate; depositing a plurality of alternative layers of oxygen-containing dielectric layers and insulating layers on the STI layer; forming a trench through the STI layer and the pluralities of alternative layers of the oxygen-containing dielectric layers and the insulating layers by a first etching process; selectively etching the insulating layers of the pluralities of alternative layer in an inner side wall of the trench by a second etching process to make the inner side wall of the trench have a vertical stacked bowls cross-sectional shape; selective epitaxially growing a buffer layer on the substrate in the trench; selective epitaxially growing a III-V group material on the buffer layer in the trench; selectively removing the pluralities of alternative layers of the oxygen-containing dielectric layers and the insulating layers; thermal oxidizing the buffer layer to form an oxide-isolation layer between the substrate and the III-V group material; depositing a high dielectric constant dielectric layer on an upper layer of the STI layer and a surrounding of the III-V group material; and depositing a conducting material surrounding the high dielectric constant dielectric layer for forming a gate electrode.

In an aspect of the present disclosure, the step of depositing the STI layer on the substrate comprises: a thickness of the STI layer is between 10 nm and 100 nm.

In an aspect of the present disclosure, the step of depositing the pluralities of alternative layers of the oxygen-containing dielectric layers and the insulating layers comprises: the material of the oxygen-containing dielectric layers contains $SiO_2$, SiOF, SiON or a compound of them.

In an aspect of the present disclosure, the step of depositing the pluralities of alternative layers of the oxygen-containing dielectric layers and the insulating layers comprises: a thickness of each oxygen-containing dielectric layer is between 2 nm and 10 nm.

In an aspect of the present disclosure, the step of depositing the pluralities of alternative layers of the oxygen-containing dielectric layers and the insulating layers comprises: the material of the insulating layers contains phosphosilicate glass (PSG), borosilicate glass (BSG), borophospho-silicate Glass (BPSG) or a compound of them.

In an aspect of the present disclosure, the step of depositing the pluralities of alternative layers of the oxygen-containing dielectric layers and the insulating layers comprises: a thickness of each insulating layer is between 5 nm and 10 nm.

In an aspect of the present disclosure, the step of selective epitaxially growing the buffer layer on the substrate in the trench comprises: the material of the buffer layer contains GaAs or SiGe.

In an aspect of the present disclosure, the step of selective epitaxially growing the buffer layer on the substrate in the trench comprises: a thickness of the buffer layer is between 10 nm and 100 nm.

In an aspect of the present disclosure, the step of selective epitaxially growing the III-V group material on the buffer layer in the trench comprises: the material of the III-V group material contains InGaAs, InAs or InSb.

In an aspect of the present disclosure, the step of forming the trench through the STI layer and the pluralities of alternative layers of the oxygen-containing dielectric layers and the insulating layers by the first etching process comprises: the first etching process uses a dry-etching method.

In an aspect of the present disclosure, the step of selectively etching the insulating layers of the pluralities of alternative layer in the inner side wall of the trench by the second etching process comprises: the second etching process uses a wet-etching method.

In an aspect of the present disclosure, the step of thermal oxidizing the buffer layer to form the oxide-isolation layer between the substrate and the III-V group material comprises: the thermal oxidizing process of the buffer layer uses an in-situ steam generation (ISSG) oxidation method or a rapid thermal oxidation method.

In an aspect of the present disclosure, a reactant gas of the ISSG oxidation method is $O_2$ or a mixed gas of $N_2O$ and $N_2$.

In an exemplary embodiment, a FinFET is provided. The FinFET comprises a substrate; a shallow trench isolation (STI) layer formed on the substrate, wherein the STI layer has a trench; a buffer layer formed on the substrate in the trench; a III-V group material formed on the buffer layer, wherein the III-V group material has a vertical stacked bowls cross-sectional shape; an oxide-isolation layer formed between the substrate and the III-V group material; a high dielectric constant dielectric layer formed on an upper layer of the STI layer and a surrounding of the III-V group material; and a conducting material formed surrounding the high dielectric constant dielectric layer as a gate electrode.

In an aspect of the present disclosure, a thickness of the STI layer is between 10 nm and 100 nm.

In an aspect of the present disclosure, the material of the buffer layer contains GaAs or SiGe.

In an aspect of the present disclosure, a thickness of the buffer layer is between 10 nm and 100 nm.

In an aspect of the present disclosure, the material of the III-V group material contains InGaAs, InAs or InSb.

Aforesaid exemplary embodiments are not limited and could be selectively incorporated in other embodiments described herein.

BRIEF DESCRIPTION OF THE DRAWINGS

Exemplary embodiments will be more readily understood from the following detailed description when read in conjunction with the appended drawing, in which.

DETAILED DESCRIPTION

The following detailed description in conjunction with the drawings of a complementary nanowire semiconductor device and fabrication method thereof of the present invention represents the preferred embodiments. It should be understood that the skilled in the art can modify the present invention described herein to achieve advantageous effect of the present invention. Therefore, the following description should be understood as well known for the skilled in the art, but should not be considered as a limitation to the present invention.

Figure 1:
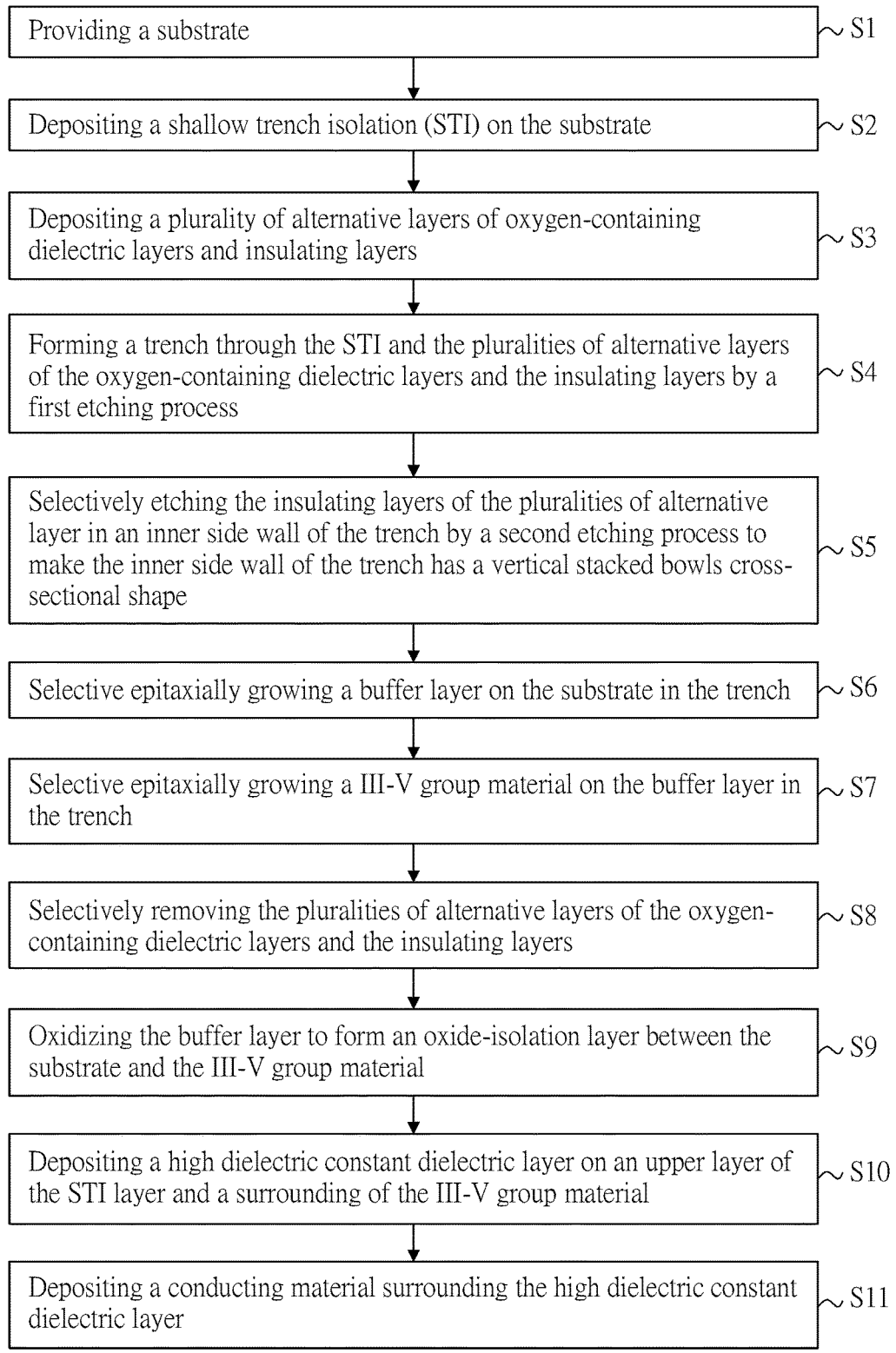
FIG. 1 depicts a flow chart of a fabrication method of a FinFET according to one embodiment of the present disclosure.
Figure 2:
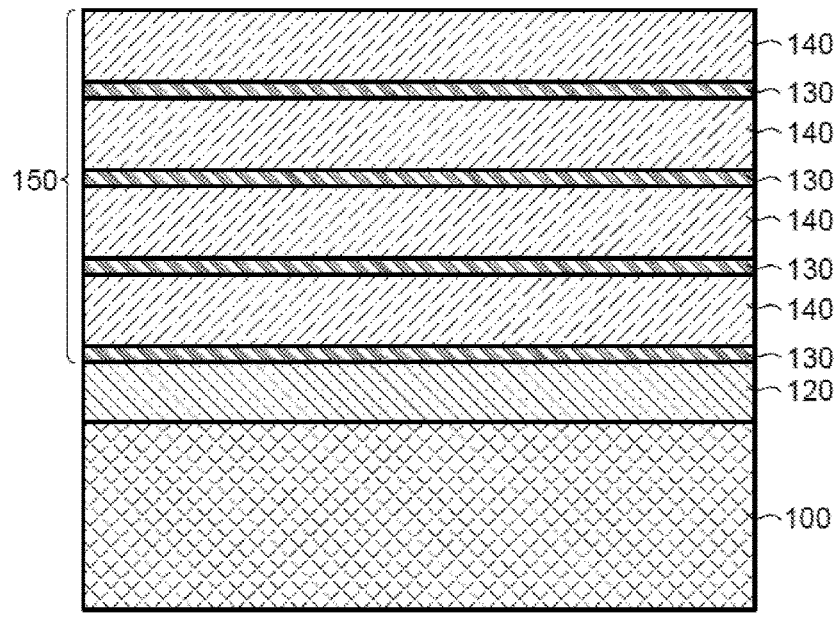
FIG. 2 depicts a cross-sectional view showing a STI layer and a plurality of alternative layers formed on a substrate according to one embodiment of the present disclosure.

The following descriptions in conjunction with the drawings describe a fin-shaped field-effect transistor and fabrication method thereof. FIG. 1 depicts a flow chart of a fabrication method of a FinFET according to one embodiment of the present disclosure, and FIG. 2 to FIG. 10 depict cross-sectional views showing each step respectively according to one embodiment of the present disclosure, in which the method comprises:

Performing step S1: Referring to FIG. 2, providing a substrate 100. In one embodiment, the substrate 100 may be a monocrystalline silicon substrate.

Performing step S2: Referring to FIG. 2 again, depositing a shallow trench isolation (STI) layer 120 on the substrate 100. In one embodiment, the material of the STI layer 120 may contain $SiO2$. In one embodiment, a thickness of the STI layer 120 may be between 10 nm and 100 nm.

Performing step S3: Referring to FIG. 2 again, depositing a plurality of alternative layers 150 of oxygen-containing dielectric layers 130 and insulating layers 140 on the STI layer 120. In one embodiment, the material of the oxygen-containing dielectric layers 130 may contain $SiO_2$, SiOF, SiON or a compound of them. In one embodiment, a thickness of each oxygen-containing dielectric layer 130 may be between 2 nm and 10 nm. In one embodiment, the material of the insulating layers 140 may contain phosphosilicate glass (PSG), borosilicate glass (BSG), borophosphosilicate Glass (BPSG) or a compound of them. In one embodiment, a thickness of each insulating layer 140 may be between 5 nm and 10 nm. In one embodiment, in step S2 and step S3, the STI layer 120, the oxygen-containing dielectric layers 130 and the insulating layers 140 may be deposited by a chemical vapor deposition (CVD) process, a metal-organic chemical vapor deposition (MOCVD), a molecular-beam epitaxy (MBE) process or an atomic layer deposition (ALD) process.

Figure 3:
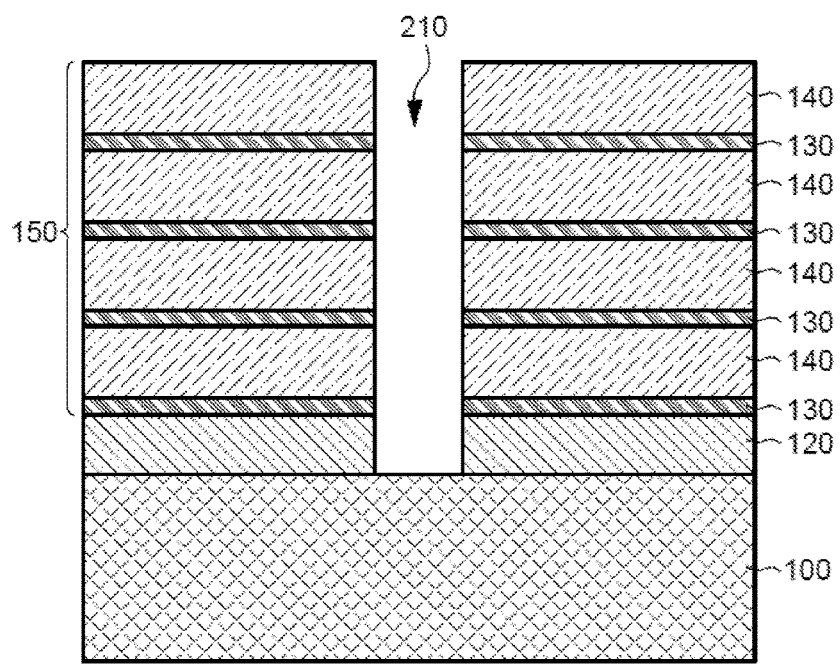
FIG. 3 depicts a cross-sectional view showing a trench formed through the STI layer and the pluralities of alternative layers according to one embodiment of the present disclosure.

Performing step S4: Referring to FIG. 3, forming a trench 210 through the STI layer 120 and the pluralities of alternative layers 150 of the oxygen-containing dielectric layers 130 and the insulating layers 140 by a first etching process. In one embodiment, the first etching process may use a dry-etching method with a mixing gas of $Cl_2$ and Ar, but it is not limited thereto.

Figure 4:
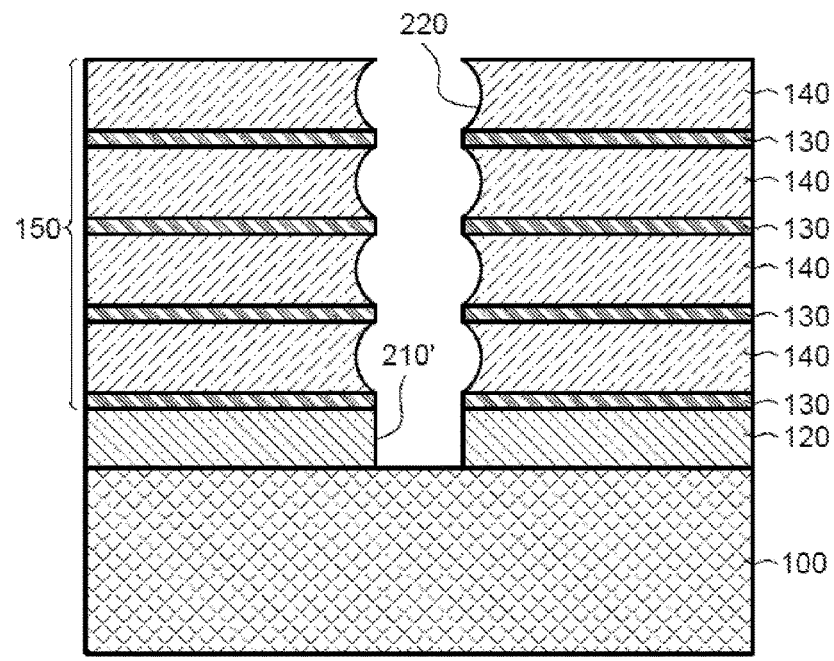
FIG. 4 depicts a cross-sectional view showing an inner sidewall of the trench having a vertical stacked bowls cross-sectional shape according to one embodiment of the present disclosure.

Performing step S5: Referring to FIG. 4, selectively etching the insulating layers 140 of the pluralities of alternative layer 150 in an inner side wall 220 of the trench 210 by a second etching process to make the inner side wall 220 of the trench 210 have a vertical stacked bowls cross-sectional shape. In one embodiment, the second etching process may use a wet-etching method with a mixed solution of $NH_3$ and $H_2O$, a solution of KOH or a solution of TMAH.

Figure 5:
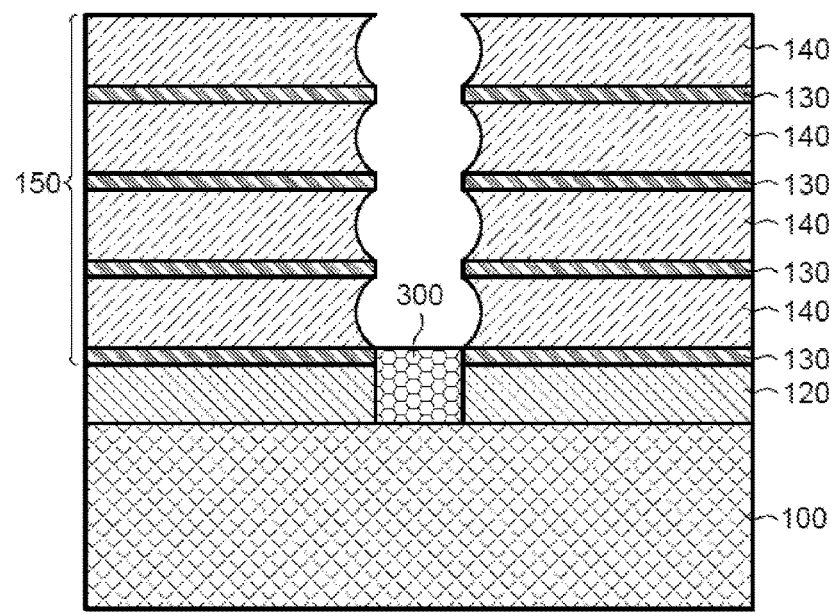
FIG. 5 depicts a cross-sectional view showing a buffer layer formed on the substrate in the trench according to one embodiment of the present disclosure.

Performing step S6: Referring to FIG. 5, selective epitaxially growing a buffer layer 300 on the substrate 100 in the trench 210. In one embodiment, the material of the buffer layer 300 may contain GaAs or SiGe. In one embodiment, a thickness of the buffer layer 300 may be similar with that of the STI layer 120, such as between 10 nm and 100 nm.

Figure 6:
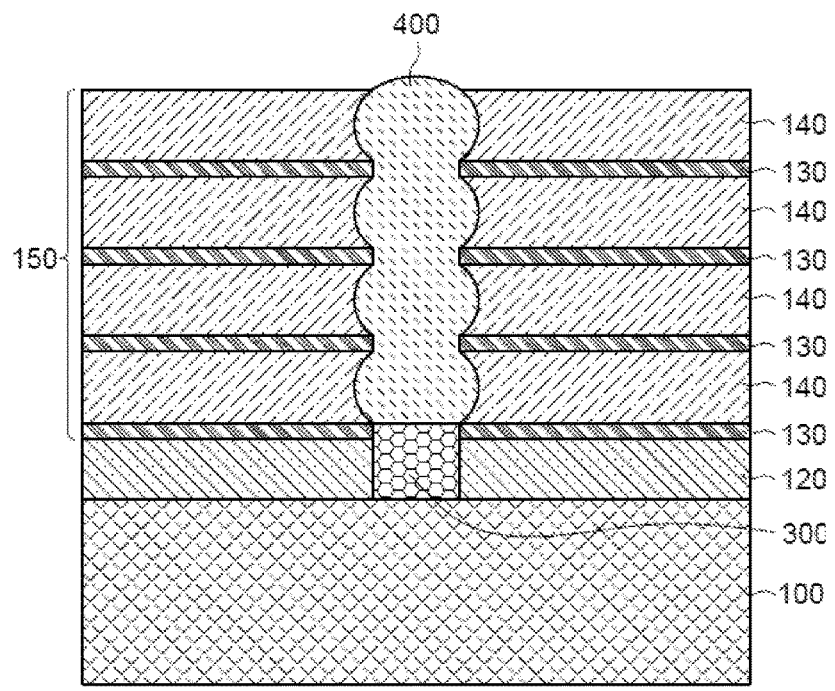
FIG. 6 depicts a cross-sectional view showing a III-V group material formed on the buffer layer in the trench according to one embodiment of the present disclosure.

Performing step S7: Referring to FIG. 6, selective epitaxially growing a III-V group material 400 on the buffer layer 300 in the trench 210. In one embodiment, the trench 210 may be filled with the III-V group material 400. In one embodiment, the material of the III-V group material 400 may contain InGaAs, InAs or InSb.

Figure 7:
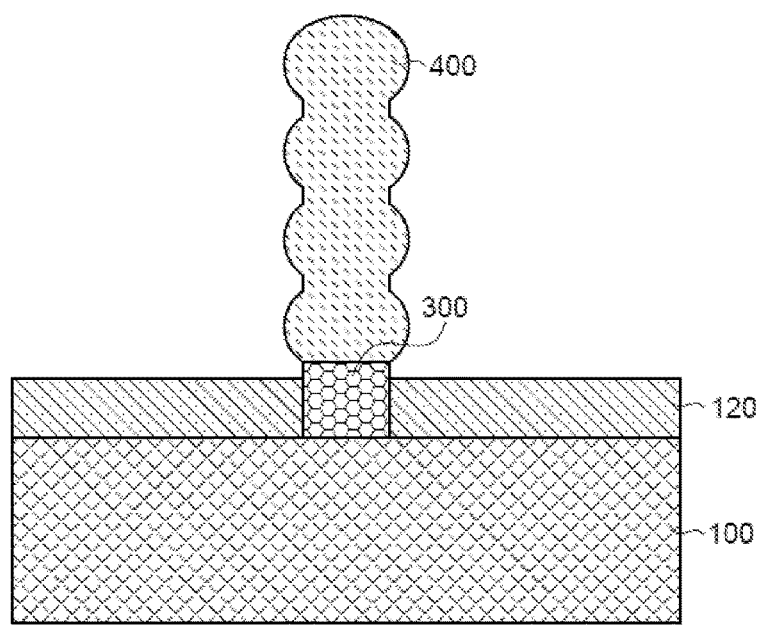
FIG. 7 depicts a cross-sectional view showing the III-V group material having a vertical stacked bowls cross-sectional shape after selectively removing the pluralities of alternative layers according to one embodiment of the present disclosure.

Performing step S8: Referring to FIG. 7, selectively removing the pluralities of alternative layers 150 of the oxygen-containing dielectric layers 130 and the insulating layers 140 surrounding the buffer layer 300 and the III-V group material 400, and then the III-V group material 400 is exposed on the STI layer 120.

Figure 8:
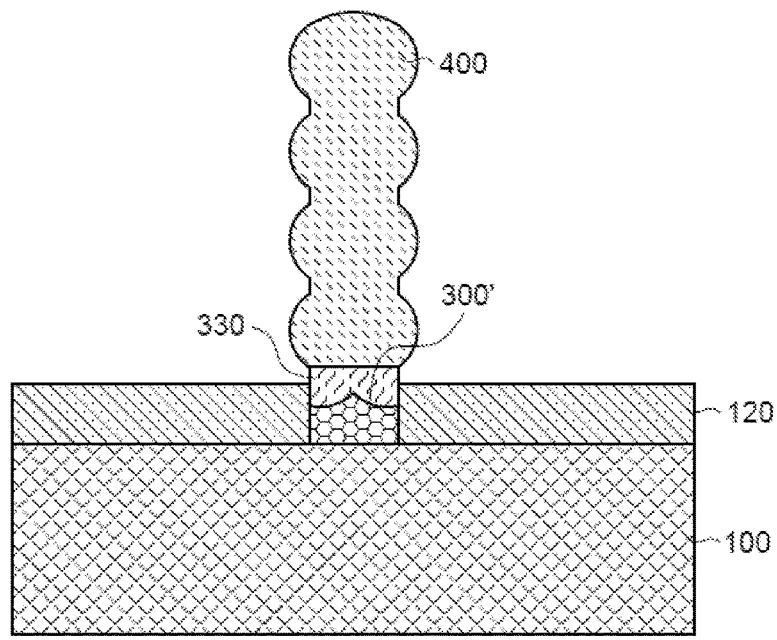
FIG. 8 depicts a cross-sectional view showing the oxide-isolation layer formed between the substrate and the III-V group material according to one embodiment of the present disclosure.

Performing step S9: Referring to FIG. 8, thermal oxidizing the buffer layer 300 to form an oxide-isolation layer 330 between the substrate 100 and the III-V group material 400. An un-oxidized buffer layer 300' is formed between the substrate 100 and the oxide-isolation layer 330. In one embodiment, the thermal oxidizing process of the buffer layer uses an in-situ steam generation (ISSG) oxidation method or a rapid thermal oxidation method. For example, a reactant gas of the ISSG oxidation method may be $O_2$ or a mixed gas of $N_2O$ and $N_2$.

Figure 9:
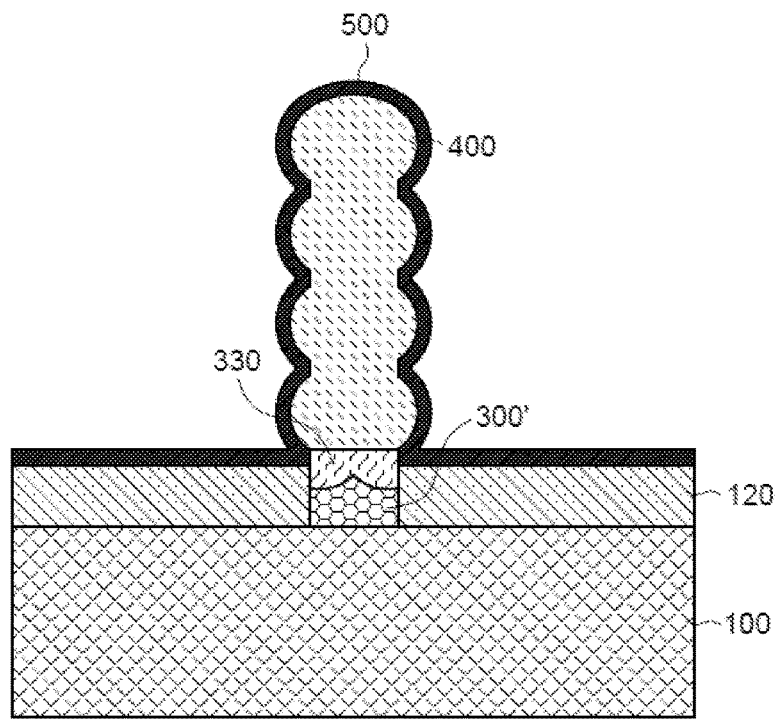
FIG. 9 depicts a cross-sectional view showing a high dielectric constant dielectric layer formed on an upper layer of the STI layer and a surrounding of the III-V group material according to one embodiment of the present disclosure.

Performing step S10: Referring to FIG. 9, depositing a high dielectric constant (high-K) dielectric layer 500 on an upper layer of the STI layer 120 and a surrounding of the III-V group material 400 to form a gate dielectric layer. In one embodiment, the material of the high-K dielectric layer 500 may be $TiO_2$, $HfO_2$ or $ZrO_2$.

Figure 10:
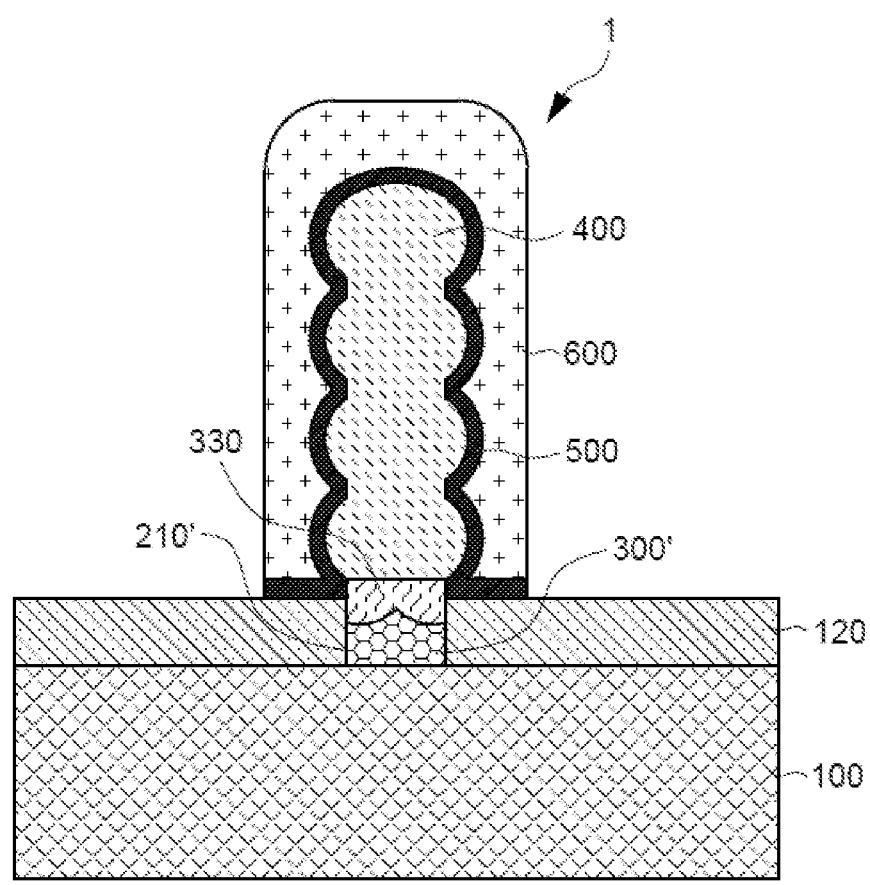
FIG. 10 depicts a cross-sectional view showing a conducting material surrounding the high dielectric constant dielectric layer according to one embodiment of the present disclosure.

Performing step S11: Referring to FIG. 10, depositing a conducting material 600 surrounding the high-K dielectric layer 500 to form a gate electrode layer. In one embodiment, the gate electrode layer 600 and the gate dielectric layer 500 are constructed a gate stack. The gate stack may be patterned by lithograph and etching. In one embodiment, in step S9, S10 and step S11, the high-K dielectric layer 500 and the conducting material 600 may be deposited by a chemical vapor deposition (CVD) process, a metal-organic chemical vapor deposition (MOCVD), a molecular-beam epitaxy (MBE) process or an atomic layer deposition (ALD) process. In one embodiment, after step S11, the method further comprises epitaxially growing or implaning source/drain material on the substrate 100 to form a source/drain electrode of the FinFET.

Correspondingly, referring to FIG. 10 again, the FinFET 1 fabricated by the steps S1 to S10 comprises the substrate 100, the STI layer 120, the buffer layer 300', the oxide-isolation layer 330, the III-V group material 400, the high-K dielectric layer 500 and the conducting material 600. The STI layer 120 is formed on the substrate 100, in which the STI layer 120 has a trench 210'. The buffer layer 300' is formed on the substrate 100 in the trench 210'. The oxide-isolation layer 330 is formed on the buffer layer 300'. The III-V group material 400 is formed on the oxide-isolation layer 330. The III-V group material 400 has the vertical stacked bowls cross-sectional shape. The high-K dielectric layer 500 is formed on an upper layer of the STI layer 120 and a surrounding of the III-V group material 400 as a gate dielectric layer. The conducting material 600 is formed surrounding the high-K dielectric layer 500 as a gate electrode layer. Moreover, the source/drain material is on the substrate 100 as the source/drain electrode of the FinFET 1.

While various embodiments in accordance with the disclosed principles has been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention (s), and their equivalents, that are protected thereby. In all instances, the scope of such claims shall be considered on their own merits in light of this disclosure, but should not be constrained by the headings herein.

What is claimed is:

1. A fabrication method of a fin-shaped field-effect transistor (FinFET), comprising the steps of:
   providing a substrate;
   depositing a shallow trench isolation (STI) layer on the substrate;
   depositing a plurality of alternative layers of oxygen-containing dielectric layers and insulating layers on the STI layer;
   forming a trench through the STI layer and the pluralities of alternative layers of the oxygen-containing dielectric layers and the insulating layers by a first etching process;
   selectively etching the insulating layers of the pluralities of alternative layer in an inner side wall of the trench by a second etching process to make the inner side wall of the trench have a vertical stacked bowls cross-sectional shape;
   selective epitaxially growing a buffer layer on the substrate in the trench;
   selective epitaxially growing a III-V group material on the buffer layer in the trench;
   selectively removing the pluralities of alternative layers of the oxygen-containing dielectric layers and the insulating layers;
   thermal oxidizing the buffer layer to form an oxide-isolation layer between the substrate and the III-V group material;
   depositing a high dielectric constant dielectric layer on an upper layer of the STI layer and a surrounding of the III-V group material; and
   depositing a conducting material surrounding the high dielectric constant dielectric layer for forming a gate electrode.

2. The method according to claim 1, wherein the step of depositing the STI layer on the substrate comprises: a thickness of the STI layer is between 10 nm and 100 nm.

3. The method according to claim 1, wherein the step of depositing the pluralities of alternative layers of the oxygen-containing dielectric layers and the insulating layers comprises: the material of the oxygen-containing dielectric layers contains $SiO_2$, SiOF, SiON or a compound of them.

4. The method according to claim 1, wherein the step of depositing the pluralities of alternative layers of the oxygen-containing dielectric layers and the insulating layers comprises: a thickness of each oxygen-containing dielectric layer is between 2 nm and 10 nm.

5. The method according to claim 1, wherein the step of depositing the pluralities of alternative layers of the oxygen-containing dielectric layers and the insulating layers comprises: the material of the insulating layers contains phosphosilicate glass (PSG), borosilicate glass (BSG), borophospho-silicate Glass (BPSG) or a compound of them.

6. The method according to claim 1, wherein the step of depositing the pluralities of alternative layers of the oxygen-containing dielectric layers and the insulating layers comprises: a thickness of each insulating layer is between 5 nm and 10 nm.

7. The method according to claim 1, wherein the step of selective epitaxially growing the buffer layer on the substrate in the trench comprises: the material of the buffer layer contains GaAs or SiGe.

8. The method according to claim 1, wherein the step of selective epitaxially growing the buffer layer on the substrate in the trench comprises: a thickness of the buffer layer is between 10 nm and 100 nm.

9. The method according to claim 1, wherein the step of selective epitaxially growing the III-V group material on the buffer layer in the trench comprises: the material of the III-V group material contains InGaAs, InAs or InSb.

10. The method according to claim 1, wherein the step of forming the trench through the STI layer and the pluralities of alternative layers of the oxygen-containing dielectric layers and the insulating layers by the first etching process comprises: the first etching process uses a dry-etching method.

11. The method according to claim 1, wherein the step of selectively etching the insulating layers of the pluralities of alternative layer in the inner side wall of the trench by the second etching process comprises: the second etching process uses a wet-etching method.

12. The method according to claim 1, wherein the step of thermal oxidizing the buffer layer to form the oxide-isolation layer between the substrate and the III-V group material comprises: the thermal oxidizing process of the buffer layer uses an in-situ steam generation (ISSG) oxidation method or a rapid thermal oxidation method.

13. The method according to claim 12, wherein a reactant gas of the ISSG oxidation method is $O_2$ or a mixed gas of $N_2O$ and $N_2$.

14. A fin-shaped field-effect transistor (FinFET) fabricated by the method of claim 1, comprising:
   the substrate;
   the shallow trench isolation (STI) layer formed on the substrate, wherein the STI layer has the trench;
   the buffer layer formed on the substrate in the trench;
   the III-V group material formed on the buffer layer, wherein the III-V group material has the vertical stacked bowls cross-sectional shape;
   the oxide-isolation layer formed between the substrate and the III-V group material;
   the high dielectric constant dielectric layer formed on the upper layer of the STI layer and the surrounding of the III-V group material; and
   the conducting material formed surrounding the high dielectric constant dielectric layer.

15. The FinFET according to claim 14, wherein a thickness of the STI layer is between 10 nm and 100 nm.

16. The FinFET according to claim 14, wherein the material of the buffer layer contains GaAs or SiGe.

17. The FinFET according to claim 14, wherein a thickness of the buffer layer is between 10 nm and 100 nm.

18. The FinFET according to claim 14, wherein the material of the III-V group material contains InGaAs, InAs or InSb.

* * * * *